(12) United States Patent
Liao (10) Patent No.: US 11,456,398 B2
(45) Date of Patent: Sep. 27, 2022

(54) METHOD OF MANUFACTURING LED CHIP PACKAGE STRUCTURE

(71) Applicant: ASTI GLOBAL INC., TAIWAN, Taichung (TW)

(72) Inventor: Chien-Shou Liao, New Taipei (TW)

(73) Assignee: ASTI GLOBAL INC., TAIWAN, Taichung (TW)

( * ) Notice: Subject to any disclaimer, the term of this patent is extended or adjusted under 35 U.S.C. 154(b) by 93 days.

(21) Appl. No.: 17/020,979

(22) Filed: Sep. 15, 2020

(65) Prior Publication Data
US 2021/0249557 A1   Aug. 12, 2021

(30) Foreign Application Priority Data
Feb. 10, 2020   (TW) ................................. 109104027

(51) Int. Cl.
*H01L 33/00*   (2010.01)
*H01L 33/52*   (2010.01)

(52) U.S. Cl.
CPC .......... *H01L 33/0095* (2013.01); *H01L 33/52* (2013.01); *H01L 2933/005* (2013.01)

(58) Field of Classification Search
CPC ........... H01L 33/0095; H01L 2933/005; H01L 33/52–56
See application file for complete search history.

(56) References Cited

U.S. PATENT DOCUMENTS

| 2013/0149508 A1* | 6/2013 | Kwak | ..................... B32B 27/06 428/690 |
| 2014/0008685 A1* | 1/2014 | Basin | ..................... H01L 33/50 438/27 |
| 2017/0331003 A1* | 11/2017 | Cheng | ................... H01L 33/507 |

FOREIGN PATENT DOCUMENTS

| CN | 101749653 A | 6/2010 | | |
| CN | 102107178 A | 6/2011 | | |
| CN | 107876320 A | * 4/2018 | ............ | B05C 11/10 |
| CN | 107876320 A | 4/2018 | | |
| CN | 110034221 A | 7/2019 | | |

\* cited by examiner

*Primary Examiner* — Jay C Chang
*Assistant Examiner* — Mikka Liu
(74) *Attorney, Agent, or Firm* — Winston Hsu (57) ABSTRACT

An LED chip package structure and a method of manufacturing the same are provided. The method of manufacturing the LED chip package structure includes providing a phosphor film including a phosphor layer and an outer enclosing layer for enclosing the phosphor layer that includes a plurality of phosphor particles; removing the outer enclosing layer from the phosphor layer for exposing the phosphor layer; and then covering an LED chip with the phosphor layer. The LED chip package structure includes an LED chip and a phosphor layer for covering the LED chip. The phosphor layer includes a plurality of phosphor particles tightly connected with each other, and the phosphor layer has no non-phosphor material. Therefore, the LED chip can be directly covered by the phosphor layer without the outer enclosing layer, and the phosphor particle without the non-phosphor material can directly contact the LED chip.

6 Claims, 9 Drawing Sheets

METHOD OF MANUFACTURING LED CHIP PACKAGE STRUCTURE

CROSS-REFERENCE TO RELATED PATENT APPLICATION

This application claims the benefit of priority to Taiwan Patent Application No. 109104027, filed on Feb. 10, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a chip package structure and a method of manufacturing the same, and more particularly to an LED chip package structure and a method of manufacturing the same.

BACKGROUND OF THE DISCLOSURE

In the related art, a phosphor resin is formed by mixing phosphor particles and a package material, and then a light-emitting diode (LED) chip can be covered by the phosphor resin with the phosphor particles.

SUMMARY OF THE DISCLOSURE

In response to the above-referenced technical inadequacies, the present disclosure provides an LED chip package structure and a method of manufacturing the same.

In one aspect, the present disclosure provides a method of manufacturing an LED chip package structure, including: providing a phosphor film including a phosphor layer and an outer enclosing layer for enclosing the phosphor layer, wherein the phosphor layer includes a plurality of phosphor particles tightly connected with each other; placing the phosphor film on a surface of a liquid in a liquid tank; using a solvent to dissolve the outer enclosing layer so as to remove the outer enclosing layer from the phosphor layer and expose the phosphor layer; and then performing a step (A) or a step (B). The step (A) includes gradually leaking the liquid away from the liquid tank so as to make the phosphor layer gradually approach an LED chip that has been disposed on a bottom surface inside the liquid tank in advance until a top surface and a peripheral surface of the LED chip are covered by the phosphor layer. The step (B) includes gradually raising an LED chip that has been disposed inside the liquid tank in advance by a lifting device so as to make the LED chip gradually approach the phosphor layer until a top surface and a peripheral surface of the LED chip are covered by the phosphor layer.

In another aspect, the present disclosure provides a method of manufacturing an LED chip package structure, including: providing a phosphor film including a phosphor layer and an outer enclosing layer for enclosing the phosphor layer, wherein the phosphor layer includes a plurality of phosphor particles; removing the outer enclosing layer from the phosphor layer so as to expose the phosphor layer; and then covering an LED chip by the phosphor layer.

In certain embodiments, the step of removing the outer enclosing layer from the phosphor layer further includes: placing the phosphor film on a first position, wherein the first position is located on a surface of a first liquid in a first liquid tank; and then using a solvent to dissolve the outer enclosing layer so as to completely remove the outer enclosing layer from the phosphor layer.

In certain embodiments, the step of covering the LED chip by the phosphor layer further includes: placing the phosphor layer on a second position, wherein the second position is located on a surface of a second liquid in a second liquid tank; and then performing a step (A) or a step (B). The step (A) includes gradually leaking the first liquid away from the first liquid tank so as to make the phosphor layer gradually approach the LED chip that has been disposed on a bottom surface inside the first liquid tank in advance until a top surface and a peripheral surface of the LED chip are covered by the phosphor layer. The step (B) includes gradually raising an LED chip that has been disposed inside the second liquid tank in advance by a lifting device so as to make the LED chip gradually approach the phosphor layer until a top surface and a peripheral surface of the LED chip are covered by the phosphor layer.

In certain embodiments, the step of covering the LED chip by the phosphor layer further includes performing a step (A) or a step (B). The step (A) includes gradually leaking the first liquid away from the first liquid tank so as to make the phosphor layer gradually approach an LED chip that has been disposed on a bottom surface inside the first liquid tank in advance until a top surface and a peripheral surface of the LED chip are covered by the phosphor layer. The step (B) includes gradually raising the LED chip that has been disposed inside the first liquid tank in advance by a lifting device until a top surface and a peripheral surface of the LED chip are covered by the phosphor layer.

In certain embodiments, after the step of covering the LED chip by the phosphor layer, the method further includes: forming a phosphor protecting material on the phosphor layer, wherein the top surface and the peripheral surface of the phosphor layer are covered by the phosphor protecting material; and then curing the phosphor protecting material by irradiation or heating to form a phosphor protection layer for covering the top surface and the peripheral surface of the phosphor layer.

In yet another aspect, the present disclosure provides an LED chip package structure, including an LED chip and a phosphor layer covering the LED chip. The phosphor layer includes a plurality of phosphor particles tightly connected with each other and directly contacting the LED chip, and the phosphor layer is formed without non-phosphor material.

In certain embodiments, the LED chip package structure further includes a phosphor protection layer formed on the phosphor layer, a top surface and a peripheral surface of the LED chip are covered by the phosphor layer, and a top surface and a peripheral surface of the phosphor layer are covered by the phosphor protection layer.

Therefore, by virtue of "providing a phosphor film including a phosphor layer and an outer enclosing layer for enclosing the phosphor layer that includes a plurality of phosphor particles", "removing the outer enclosing layer from the phosphor layer for exposing the phosphor layer" and "covering an LED chip by the phosphor layer", the LED chip can be directly covered by the phosphor layer that is not enclosed by the outer enclosing layer, and the phosphor particles can directly contact the LED chip.

Furthermore, by virtue of "the LED chip package structure including a phosphor layer covering the LED chip", "the phosphor layer including a plurality of phosphor particles tightly connected with each other" and "the phosphor layer is formed without non-phosphor material", the phosphor particles without the non-phosphor material can directly contact the LED chip.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1:
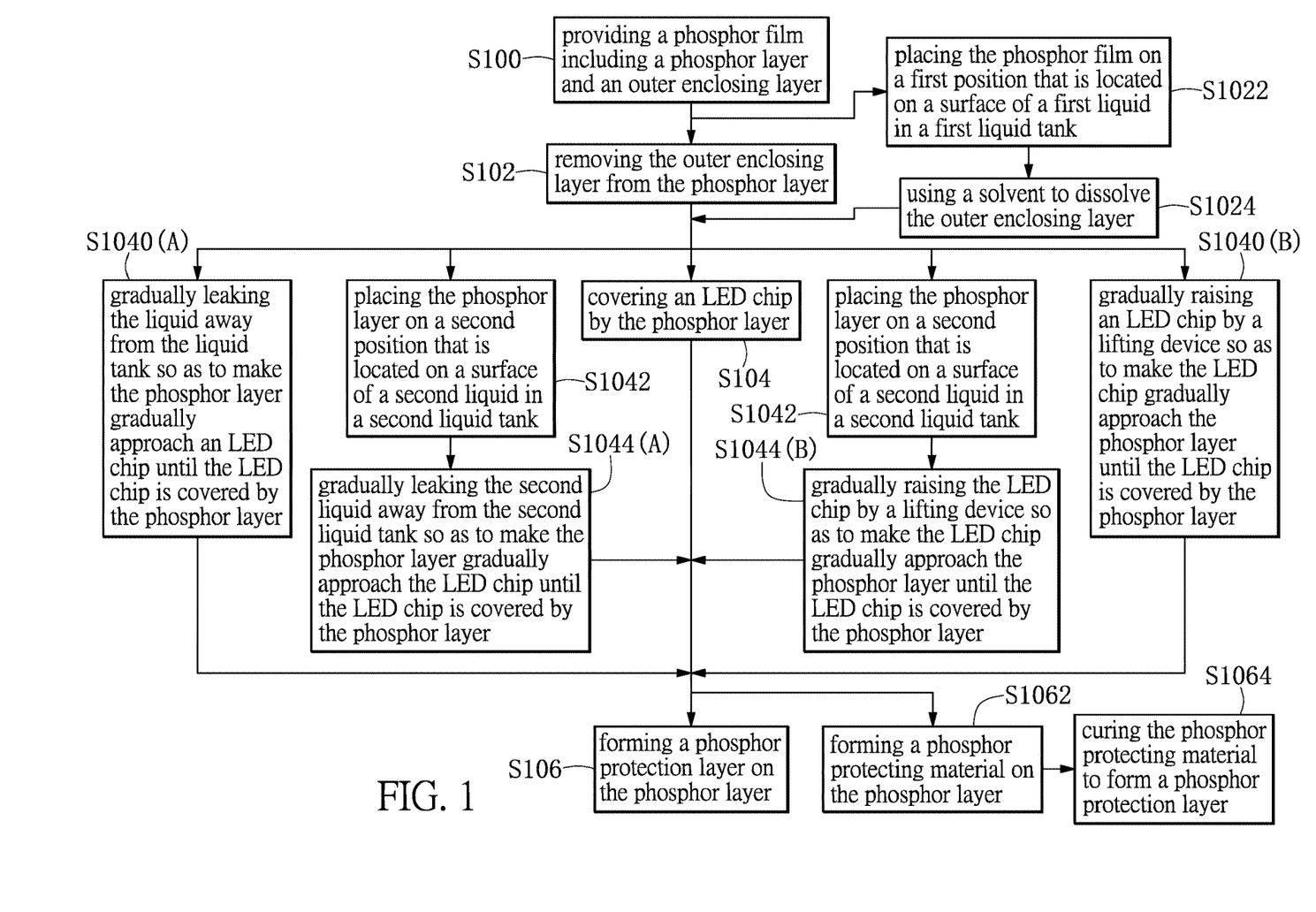
FIG. 1 is a flowchart of a method of manufacturing an LED chip package structure.
Figure 2:
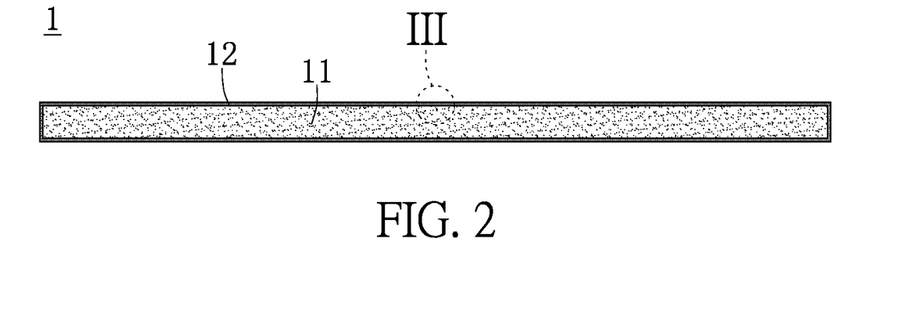
FIG. 2 is a schematic view of a phosphor film according to a first embodiment of the present disclosure, and is also a schematic view of step S100 of a method of manufacturing an LED chip package structure according to the first embodiment of the present disclosure.
Figure 3:
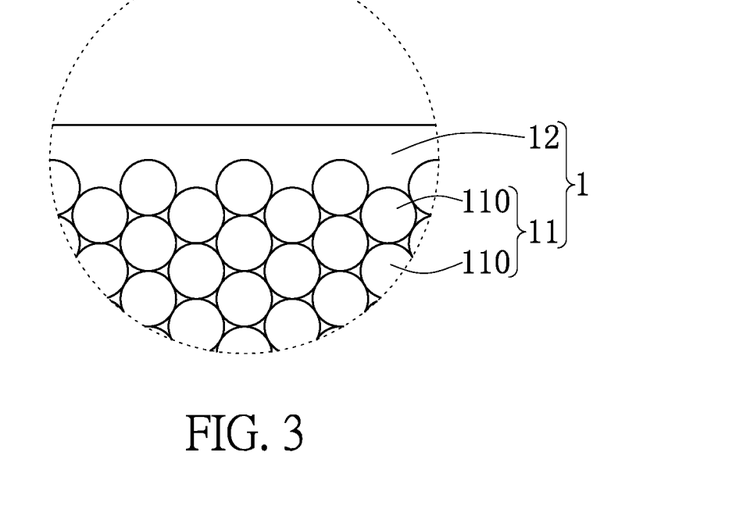
FIG. 3 shows an enlarged schematic view of part III of FIG. 2.
Figures 4, 5:
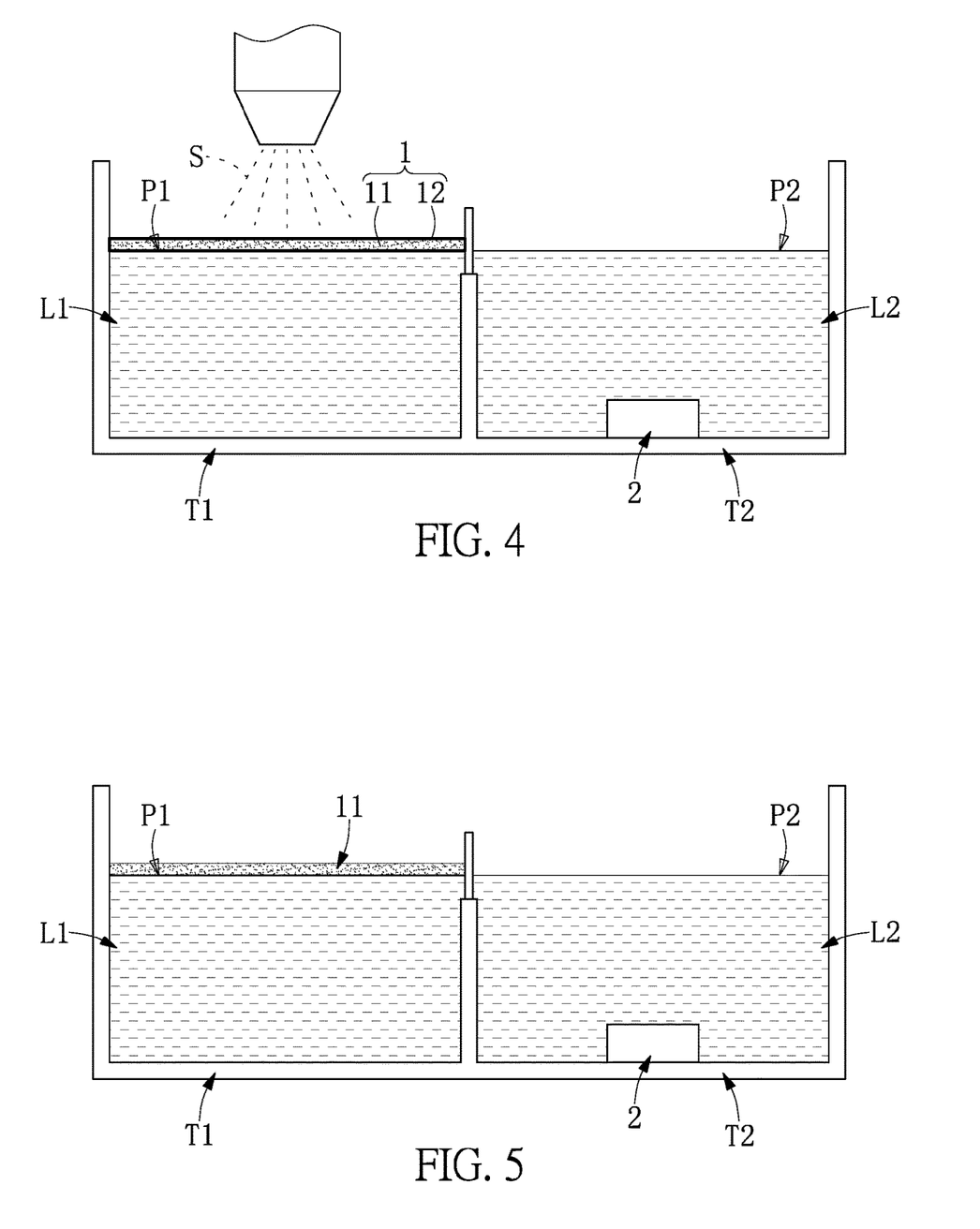
FIG. 4 is a schematic view of step S1022 of the method of manufacturing the LED chip package structure according to the first embodiment of the present disclosure.
FIG. 5 is a schematic view of step S102 and step S1024 of the method of manufacturing the LED chip package structure according to the first embodiment of the present disclosure.
Figure 9:
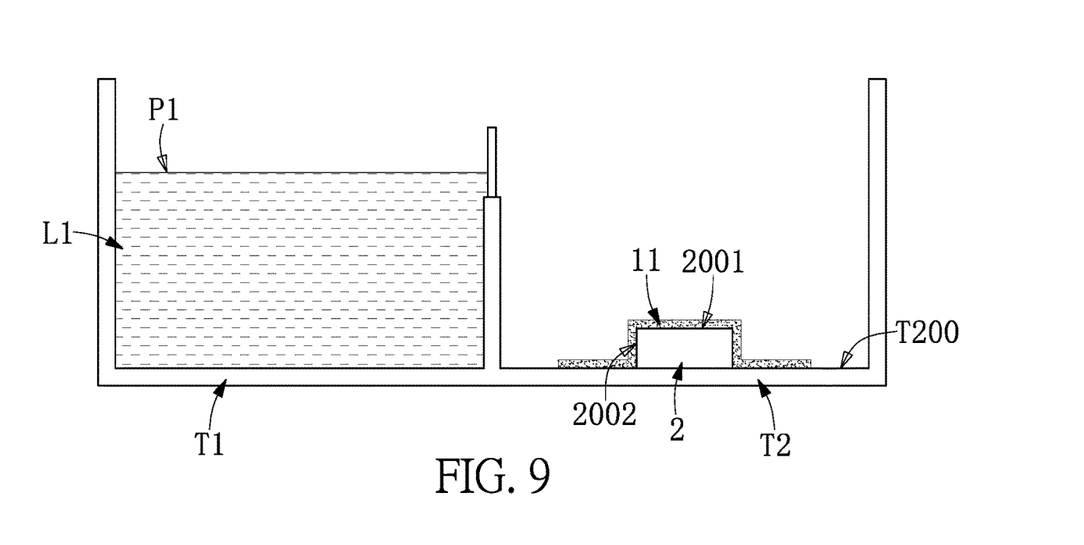
FIG. 9 is a schematic view of step S1044(A) of the method of manufacturing the LED chip package structure having been performed according to the first embodiment of the present disclosure.

Referring to FIG. 1 to FIG. 11, a first embodiment of the present disclosure provides a method of manufacturing an LED chip package structure, including: firstly, referring to FIG. 1 to FIG. 3, providing a phosphor film 1 including a phosphor layer 11 and an outer enclosing layer 12 for enclosing the phosphor layer 11, wherein the phosphor layer 11 includes a plurality of phosphor particles 110 (step S100); next, referring to FIG. 1, FIG. 4 and FIG. 5, removing the outer enclosing layer 12 from the phosphor layer 11 so as to expose the phosphor layer 11 (step S102); and then referring to FIG. 1 and FIG. 9, covering an LED chip 2 by the phosphor layer 11 (step S104).

Figure 11:
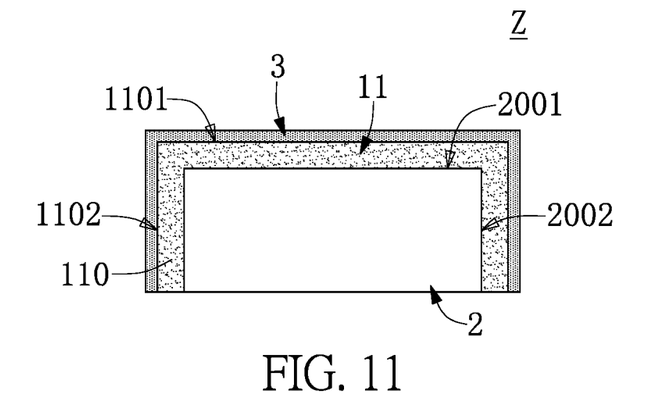
FIG. 11 is a schematic view of the LED chip package structure according to the first embodiment of the present disclosure, and is a schematic view of step S1064 of the method of manufacturing the LED chip package structure.

For example, referring to FIG. 1 and FIG. 11, after the LED chip 2 are covered by the phosphor layer 11, the method further includes forming a phosphor protection layer 3 on the phosphor layer 11 (step S106), wherein a top surface 1101 and a peripheral surface 1102 of the phosphor layer 11 are covered by the phosphor protection layer 3. However, the aforementioned description is merely an example and is not meant to limit the scope of the present disclosure.

For example, referring to FIG. 1, FIG. 4 and FIG. 5, the step S102 of removing the outer enclosing layer 12 from the phosphor layer 11 further includes: firstly, referring to FIG.

1 and FIG. 4, placing the phosphor film 1 on a first position P1, wherein the first position P1 is located on a surface of a first liquid L1 in a first liquid tank T1 (step S1022); and then referring to FIG. 1, FIG. 4 and FIG. 5, using a solvent S to dissolve the outer enclosing layer 12 so as to remove the outer enclosing layer 12 from the phosphor layer 11 (step S1024). More particularly, the first liquid L1 may be water or other liquid similar to water, so that the outer enclosing layer 12 can be dissolved by the first liquid L1. In addition, the outer enclosing layer 12 may be made of any type of water-soluble material or non-water-soluble material, and the outer enclosing layer 12 can be used to cover the phosphor layer 11 or can be mixed with the phosphor layer 11 with the phosphor particles 110. The water-soluble material may be a water soluble macromolecular polymer such as PVA that can be dissolved by glycerine or phenol etc. However, the aforementioned description is merely an example and is not meant to limit the scope of the present disclosure.

Figure 6:
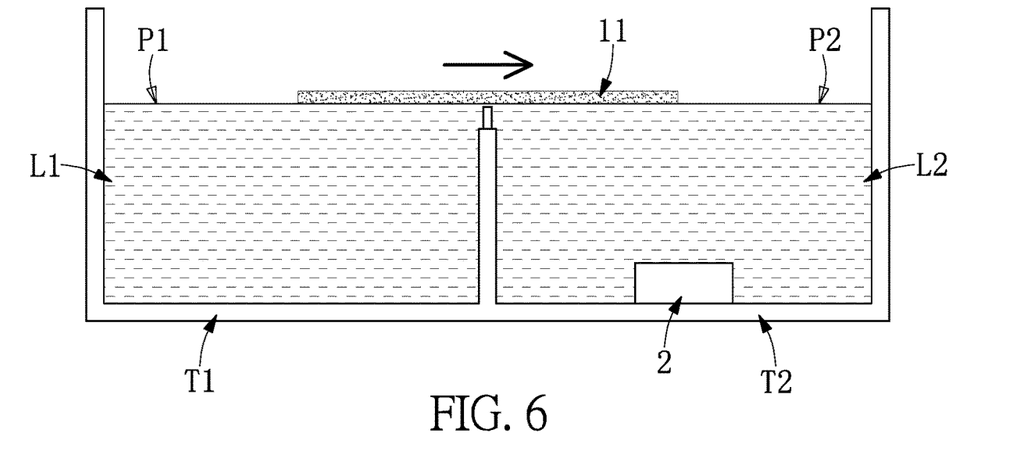
FIG. 6 is a schematic view of step S1042 of the method of manufacturing the LED chip package structure according to the first embodiment of the present disclosure.
Figure 7:
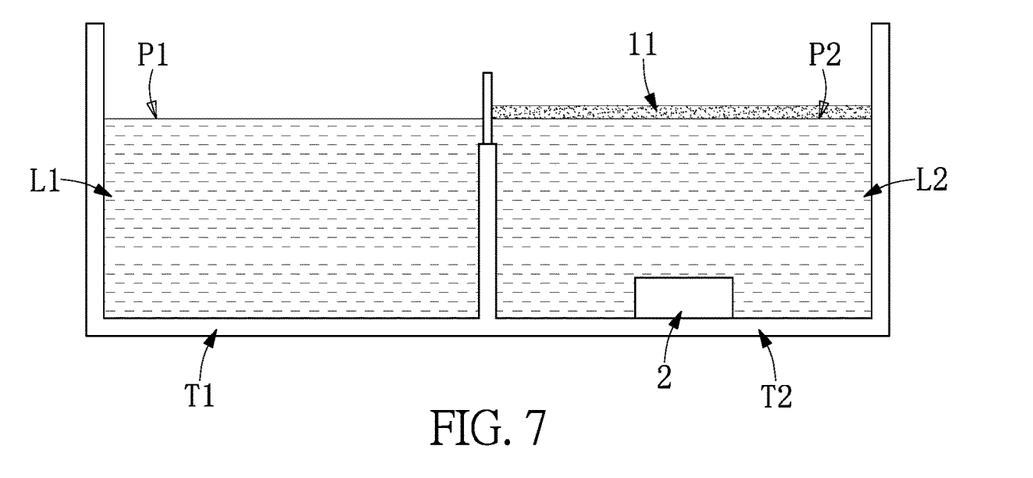
FIG. 7 is a schematic view of step S104 of the method of manufacturing the LED chip package structure according to the first embodiment of the present disclosure.
Figure 8:
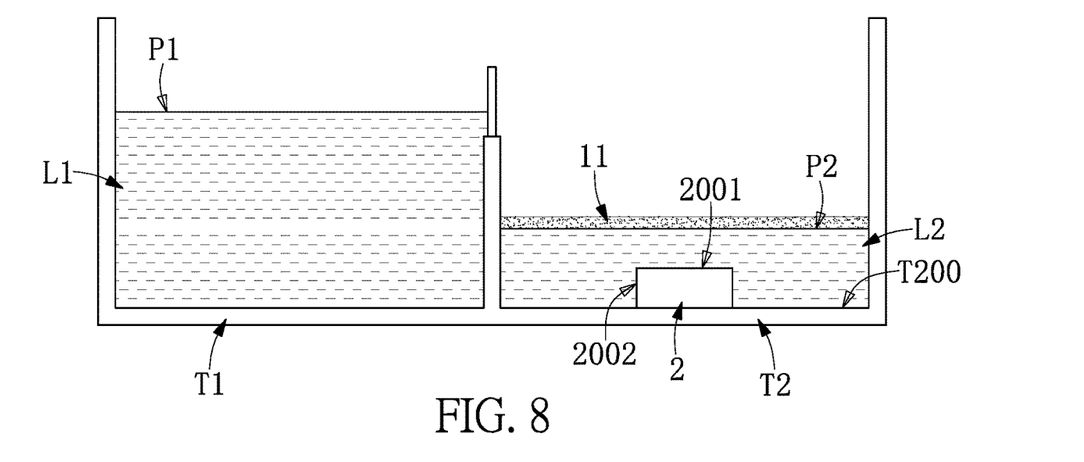
FIG. 8 is a schematic view of step S1044(A) of the method of manufacturing the LED chip package structure being performing according to the first embodiment of the present disclosure.

For example, referring to FIG. 1 and FIG. 5 to FIG. 9, after the LED chip 2 is covered by the phosphor layer 11 (step S104), the method further includes: firstly, referring to FIG. 1, FIG. 6 and FIG. 7, placing the phosphor layer 11 on a second position P2, wherein the second position P2 is located on a surface of a second liquid L2 in a second liquid tank T2 (step S1042); and then referring to FIG. 1, FIG. 8 and FIG. 9, gradually leaking (or removing) the second liquid L2 away from the second liquid tank T2 so as to make the phosphor layer 11 gradually approach (gradually close to) the LED chip 2 that have been disposed on a bottom surface T200 inside the second liquid tank T2 in advance until a top surface 2001 and a peripheral surface 2002 of the LED chip 2 are covered by the phosphor layer 11 (step S1044(A)). It should be noted that when the second liquid L2 is gradually leaked (removed) away from the second liquid tank T2, the phosphor layer 11 can be correctly positioned on the LED chip 2 through an image capturing device (such as a charge coupled device (CCD)). Moreover, when the phosphor layer 11 is moved to the second position P2, the outer enclosing layer 12 that has been removed from the phosphor layer 11 would be remained in the first liquid tank T1 and would not flow into the second liquid tank T2, or the outer enclosing layer 12 that has been removed from the phosphor layer 11 would be totally removed from the first liquid tank T1. In addition, the first liquid L1 and the second liquid L2 may be water or other liquid similar to water, and the first liquid L1 and the second liquid L2 may be the same or different liquid. However, the aforementioned description is merely an example and is not meant to limit the scope of the present disclosure.

Figure 10:
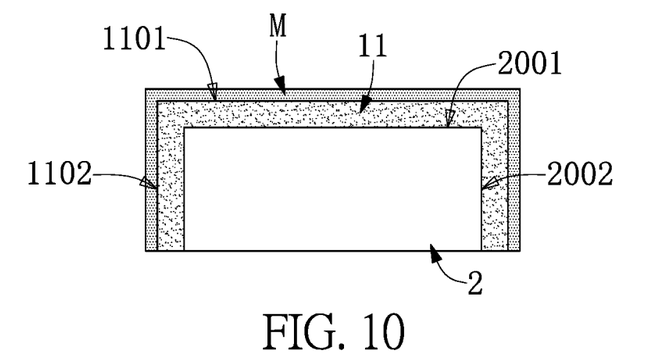
FIG. 10 is a schematic view of step S1062 of the method of manufacturing the LED chip package structure according to the first embodiment of the present disclosure.

For example, referring to FIG. 1, FIG. 10 and FIG. 11, the step S106 of forming the phosphor protection layer 3 on the phosphor layer 11 further includes: firstly, referring to FIG. 1 and FIG. 10, forming a phosphor protecting material M on the phosphor layer 11 so as to cover a top surface 1101 and a peripheral surface 1102 of the phosphor layer 11 (step S1062); and then referring to FIG. 1 and FIG. 11, curing the phosphor protecting material M by irradiation or heating to form a phosphor protection layer 3 for covering the top surface 1101 and the peripheral surface 1102 of the phosphor layer 11 (step S1064). However, the aforementioned description is merely an example and is not meant to limit the scope of the present disclosure.

Therefore, referring to FIG. 9, the first embodiment of the present disclosure provides an LED chip package structure Z, including an LED chip 2 and a phosphor layer 11 covering the LED chip 2. More particularly, the phosphor layer 11 includes a plurality of phosphor particles 110 tightly connected with each other, and the phosphor layer 11 has no non-phosphor material, so that the phosphor particles 110 can directly contact the LED chip 2. For example, the phosphor layer 11 includes a plurality of phosphor particles 110 tightly connected with each other, so that the phosphor layer 11 does not need to be borne by an extra carrier (such as that made of silicon or epoxy), and the phosphor layer 11 with the phosphor particles 110 can contact the LED chip 2, so that the LED chip 2 can directly contact with the phosphor particles 110 rather than contact silicon or epoxy.

For example, referring to FIG. 11, the LED chip package structure Z further includes a phosphor protection layer 3 covering the phosphor layer 11. In addition, a top surface 2001 and a peripheral surface 2002 of the LED chip 2 can be covered by the phosphor layer 11, and a top surface 1101 and a peripheral surface 1102 of the phosphor layer 11 can be covered by phosphor protection layer 3. However, the aforementioned description is merely an example and is not meant to limit the scope of the present disclosure.

Second Embodiment

Figure 12:
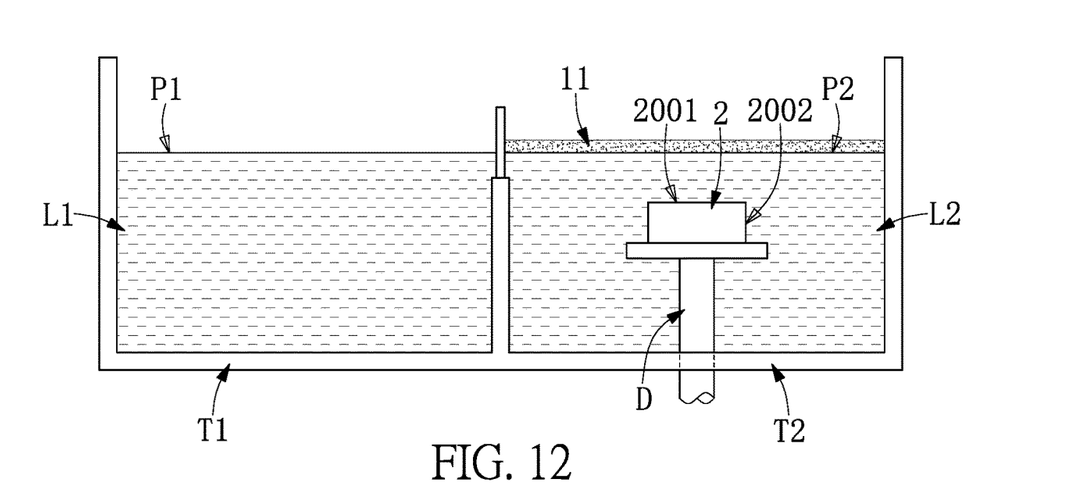
FIG. 12 is a schematic view of step S1044(B) of the method of manufacturing the LED chip package structure being performing according to a second embodiment of the present disclosure.
Figure 13:
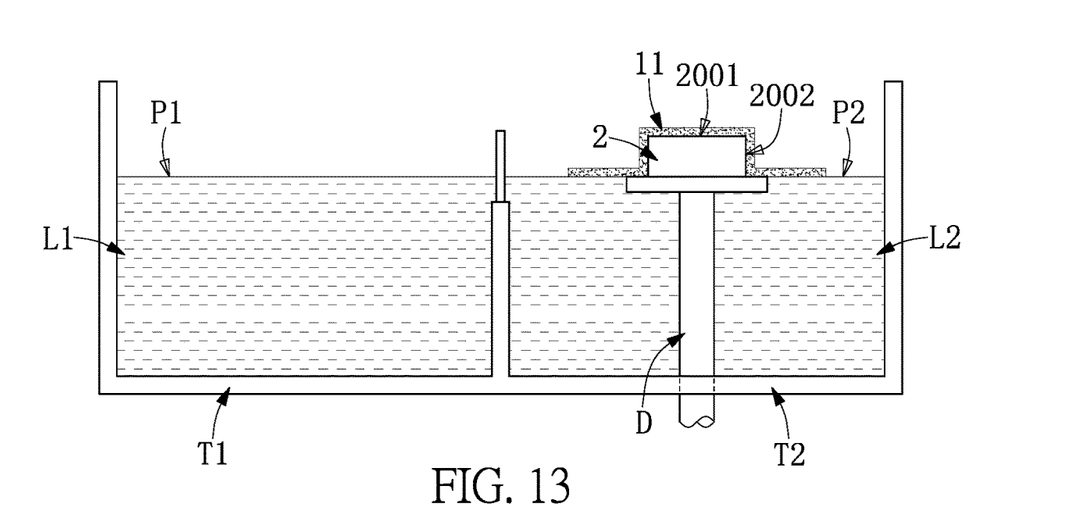
FIG. 13 is a schematic view of step S1044(B) of the method of manufacturing the LED chip package structure having been performed according to the second embodiment of the present disclosure.

Referring to FIG. 12 and FIG. 13, a second embodiment of the present disclosure provides a method of manufacturing an LED chip package structure. Comparing FIG. 12 with FIG. 8, and comparing FIG. 13 with FIG. 9, the difference between the second embodiment and the first embodiment is as follows: in the second embodiment, the method of manufacturing the LED chip package structure includes gradually raising the LED chip 2 that has been disposed inside the second liquid tank T2 in advance by a lifting device D so as to make the LED chip 2 gradually approach the phosphor layer 11 until a top surface 2001 and a peripheral surface 2002 of the LED chip 2 are covered by the phosphor layer 11 (step S1044(B)). That is to say, the step S1044(A) of the first embodiment can be replaced by the step S1044(B) of the second embodiment according to different requirements. Hence, by virtue of "gradually leaking the second liquid L2 away from the second liquid tank T2 so as to make the phosphor layer 11 gradually approach the LED chip 2" or "gradually raising the LED chip 2 by the lifting device D so as to make the LED chip 2 gradually approach the phosphor layer 11", the top surface 2001 and the peripheral surface 2002 of the LED chip 2 can be covered by the phosphor layer 11. However, the aforementioned description is merely an example and is not meant to limit the scope of the present disclosure.

It should be noted that when the LED chip 2 gradually approaches the phosphor layer 11 by the lifting device D, the phosphor layer 11 can be correctly positioned on the LED chip 2 through an image capturing device (such as a charge coupled device (CCD)).

Third Embodiment

Figure 14:
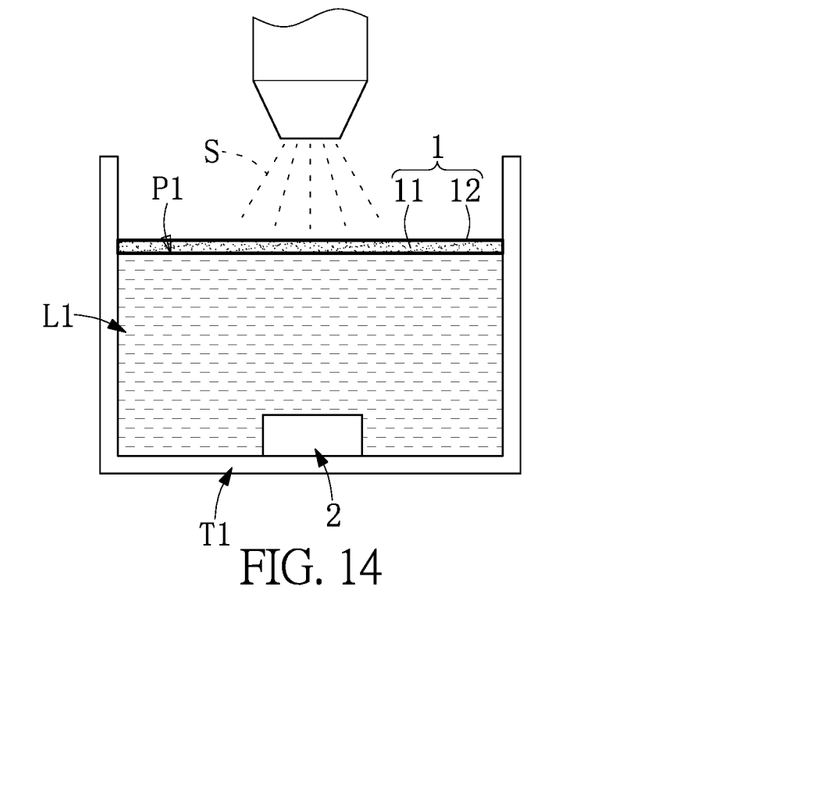
FIG. 14 is a schematic view of a phosphor film disposed on a surface of a first liquid in a first liquid tank according to a third embodiment of the present disclosure.
Figure 15:
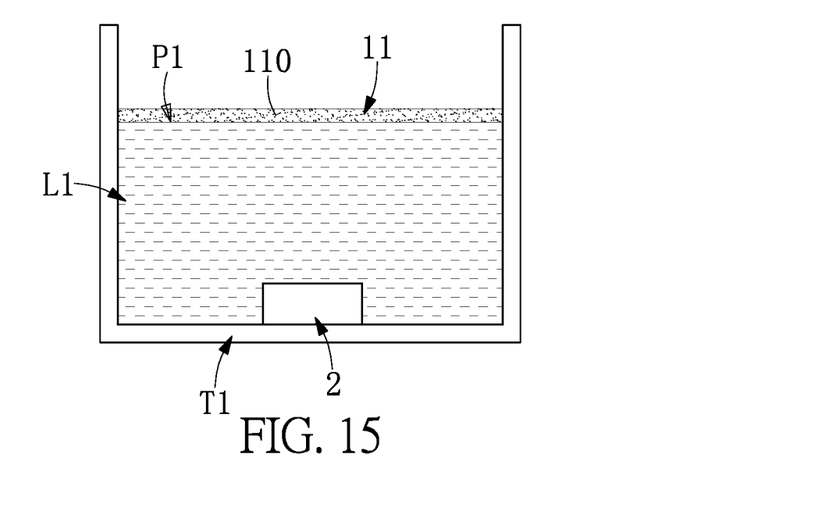
FIG. 15 is a schematic view of using a solvent to dissolve the outer enclosing layer so as to remove the outer enclosing layer from the phosphor layer and expose the phosphor layer according to the third embodiment of the present disclosure.
Figure 16:
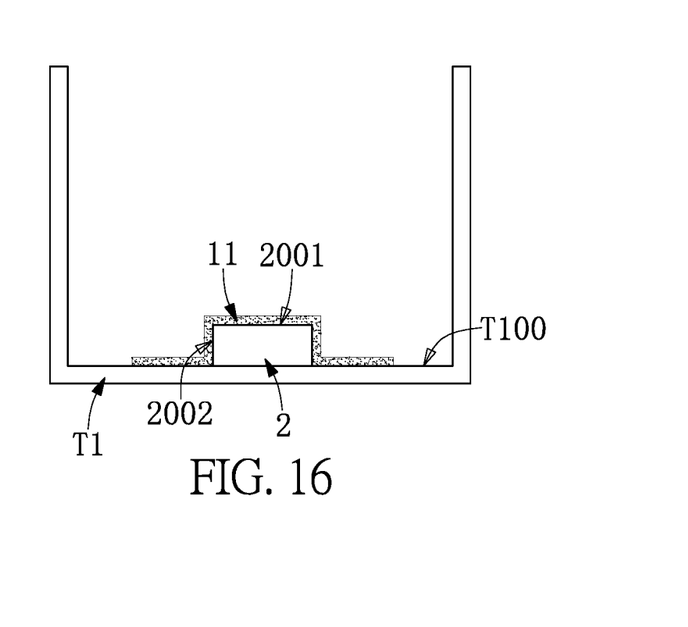
FIG. 16 is a schematic view of step S1040(A) of a method of manufacturing an LED chip package structure according to the third embodiment of the present disclosure.

Referring to FIG. 14 to FIG. 16, a third embodiment of the present disclosure provides a method of manufacturing an LED chip package structure, including: firstly, as shown in FIG. 14, providing a phosphor film 1 including a phosphor layer 11 and an outer enclosing layer 12, wherein the phosphor layer 11 includes a plurality of phosphor particles 110 tightly connected with each other; next, as shown in FIG. 14, placing the phosphor film 1 on a surface of a liquid (such as a first liquid L1) in a liquid tank (such as a first liquid tank T1); and then referring to FIG. 14 and FIG. 15, using a solvent S to dissolve the outer enclosing layer 12 so as to remove the outer enclosing layer 12 from the phosphor layer 11 and completely expose the phosphor layer 11. Comparing FIG. 16 with FIG. 9, the difference between the third embodiment and the first embodiment is as follows: in the third embodiment, the method of manufacturing the LED chip package structure includes gradually leaking the liquid (such as the first liquid L1) away from the liquid tank (such as the first liquid tank T1) so as to make the phosphor layer 11 gradually approach an LED chip 2 that has been disposed on a bottom surface T100 inside the liquid tank (such as the first liquid tank T1) in advance until a top surface 2001 and a peripheral surface 2002 of the LED chip 2 are covered by the phosphor layer 11 (step S1040(A)). Hence, the method of manufacturing the LED chip package structure can be applied to a single liquid tank (such as the first liquid tank T1) or two liquid tanks (such as the first liquid tank T1 and the second liquid tank T2). However, the aforementioned description is merely an example and is not meant to limit the scope of the present disclosure.

Fourth Embodiment

Figure 17:
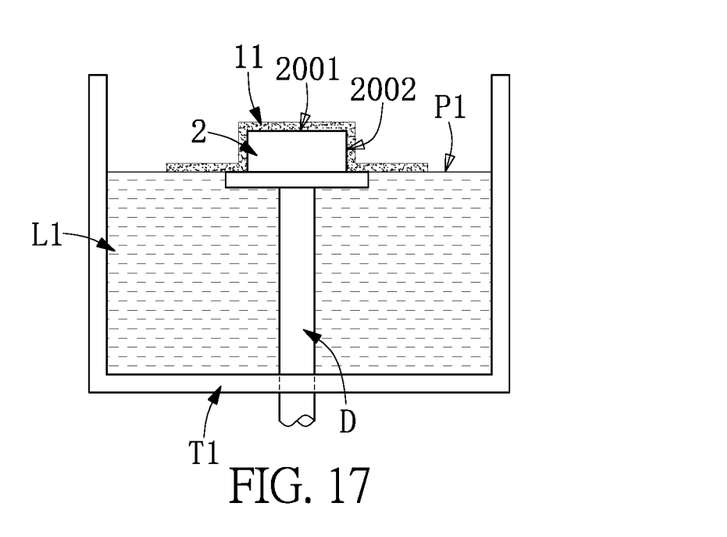
FIG. 17 is a schematic view of step S1040(B) of a method of manufacturing an LED chip package structure according to a fourth embodiment of the present disclosure.

Referring to FIG. 17, a fourth embodiment of the present disclosure provides a method of manufacturing an LED chip package structure. Comparing FIG. 17 with FIG. 16, the difference between the fourth embodiment and the third embodiment is as follows: in the fourth embodiment, the method of manufacturing the LED chip package structure includes gradually raising an LED chip 2 that has been disposed inside the liquid tank (such as the first liquid tank T1) in advance by a lifting device D so as to make the LED chip 2 gradually approach the phosphor layer 11 until a top surface 2001 and a peripheral surface of the LED chip 2 are covered by the phosphor layer 11 (step S1040(B)). Hence, by virtue of "gradually leaking the first liquid L1 away from the first liquid tank T1 so as to make the phosphor layer 11 gradually approach the LED chip 2" or "gradually raising the LED chip 2 by the lifting device D so as to make the LED chip 2 gradually approach the phosphor layer 11", the top surface 2001 and the peripheral surface 2002 of the LED chip 2 can be covered by the phosphor layer 11. However, the aforementioned description is merely an example and is not meant to limit the scope of the present disclosure.

In conclusion, by virtue of "providing a phosphor film 1 including a phosphor layer 11 and an outer enclosing layer 12 for enclosing the phosphor layer 11 that includes a plurality of phosphor particles 110", "removing the outer enclosing layer 12 for exposing the phosphor layer 11", and "covering an LED chip 2 with the phosphor layer 11", the LED chip 2 can be directly covered by the phosphor layer 11 without the outer enclosing layer 12, and the phosphor particle 110 can directly contact the LED chip 2.

Furthermore, by virtue of "the phosphor layer 11 covering the LED chip 2", "the phosphor layer 11 including a plurality of phosphor particles 110 tightly connected with each other", and "the phosphor layer has no non-phosphor material", the LED chip 2 can be directly covered by the phosphor layer 11 without the non-phosphor material.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method of manufacturing a light-emitting diode (LED) chip package structure, comprising:
   providing a phosphor film including a phosphor layer and an outer enclosing layer for enclosing the phosphor layer, wherein the phosphor layer includes a plurality of phosphor particles tightly connected with each other;
   placing the phosphor film on a surface of a liquid in a liquid tank;
   using a solvent to dissolve the outer enclosing layer so as to remove the outer enclosing layer from the phosphor layer and expose the phosphor layer; and
   performing a step (A) or a step (B);
   wherein the step (A) includes gradually leaking the liquid away from the liquid tank so as to make the phosphor layer gradually approach an LED chip that has been disposed on a bottom surface inside the liquid tank in advance until a top surface and a peripheral surface of the LED chip are covered by the phosphor layer;
   wherein the step (B) includes gradually raising an LED chip that has been disposed inside the liquid tank in advance by a lifting device so as to make the LED chip gradually approach the phosphor layer until a top surface and a peripheral surface of the LED chip are covered by the phosphor layer.

2. The method according to claim 1, wherein after the light-emitting diode (LED) chip is covered by the phosphor layer, the method further comprises:
   forming a phosphor protecting material on the phosphor layer, wherein a top surface and a peripheral surface of the phosphor layer are covered by the phosphor protecting material; and
   curing the phosphor protecting material by irradiation or heating to form a phosphor protection layer for covering the top surface and the peripheral surface of the phosphor layer.

3. A method of manufacturing a light-emitting diode (LED) chip package structure, comprising:
   providing a phosphor film including a phosphor layer and an outer enclosing layer for enclosing the phosphor layer, wherein the phosphor layer includes a plurality of phosphor particles;
   removing the outer enclosing layer from the phosphor layer so as to expose the phosphor layer; and
   covering a light-emitting diode (LED) chip by the phosphor layer,
   wherein a step of removing the outer enclosing layer from the phosphor layer further comprises:
     placing the phosphor film on a first position, wherein the first position is located on a surface of a first liquid in a first liquid tank; and
     using a solvent to dissolve the outer enclosing layer so as to completely remove the outer enclosing layer from the phosphor layer.

4. The method according to claim 3, wherein a step of covering the LED chip by the phosphor layer further comprises:
   placing the phosphor layer on a second position, wherein the second position is located on a surface of a second liquid in a second liquid tank; and
   performing a step (A) or a step (B);
   wherein the step (A) includes gradually leaking the second liquid away from the second liquid tank so as to make the phosphor layer gradually approach the LED chip that has been disposed on a bottom surface inside the second liquid tank in advance until a top surface and a peripheral surface of the LED chip are covered by the phosphor layer;

wherein the step (B) includes gradually raising the LED chip that has been disposed inside the second liquid tank in advance by a lifting device so as to make the LED chip gradually approach the phosphor layer until a top surface and a peripheral surface of the LED chip are covered by the phosphor layer.

5. The method according to claim 3, wherein the step of covering the light-emitting diode (LED) chip by the phosphor layer further comprises: performing a step (A) or a step (B);

wherein the step (A) includes gradually leaking the first liquid away from the first liquid tank so as to make the phosphor layer gradually approach the LED chip that has been disposed on a bottom surface inside the first liquid tank in advance until a top surface and a peripheral surface of the LED chip are covered by the phosphor layer;

wherein the step (B) includes gradually raising the LED chip that has been disposed inside the first liquid tank in advance by a lifting device until a top surface and a peripheral surface of the LED chip are covered by the phosphor layer.

6. The method according to claim 3, wherein after a step of covering the light-emitting diode (LED) chip by the phosphor layer, the method further comprises:

forming a phosphor protecting material on the phosphor layer, wherein a top surface and a peripheral surface of the phosphor layer are covered by the phosphor protecting material; and curing the phosphor protecting material by irradiation or heating to form a phosphor protection layer for covering the top surface and the peripheral surface of the phosphor layer.

* * * * *